(12) United States Patent
Lindstrom

(10) Patent No.: US 7,985,918 B2
(45) Date of Patent: Jul. 26, 2011

(54) THERMOELECTRIC MODULE

(75) Inventor: Joel Lindstrom, Bozeman, MT (US)

(73) Assignee: Thermohex, LLC, Bedford, NH (US)

( * ) Notice: Subject to any disclaimer, the term of this patent is extended or adjusted under 35 U.S.C. 154(b) by 415 days.

(21) Appl. No.: 12/002,154

(22) Filed: Dec. 14, 2007

(65) Prior Publication Data

US 2008/0142069 A1     Jun. 19, 2008

Related U.S. Application Data

(60) Provisional application No. 60/874,788, filed on Dec. 14, 2006.

(51) Int. Cl.
*H01L 35/00* (2006.01)
*H01L 37/00* (2006.01)

(52) U.S. Cl. ........................................ 136/200

(58) Field of Classification Search .................. 136/242, 136/200
See application file for complete search history.

(56) References Cited

U.S. PATENT DOCUMENTS

| | | | | |
|---|---|---|---|---|
| 3,879,229 A * | 4/1975 | Gilbert | ........................... | 136/208 |
| 4,249,121 A | 2/1981 | Dahlberg | | |
| 4,465,894 A * | 8/1984 | Reyes | ........................... | 136/225 |
| 4,947,648 A | 8/1990 | Harwell et al. | | |
| 6,073,449 A | 6/2000 | Watanabe et al. | | |
| 2001/0029974 A1* | 10/2001 | Cohen et al. | ................... | 136/201 |
| 2005/0115601 A1* | 6/2005 | Olsen et al. | .................... | 136/212 |
| 2007/0194465 A1* | 8/2007 | Dai et al. | ....................... | 257/794 |

* cited by examiner

*Primary Examiner* — Basia Ridley
*Assistant Examiner* — Allison Bourke
(74) *Attorney, Agent, or Firm* — Devine, Millimet & Branch; Paul C. Remus; Raymond I. Bruttomesso, Jr.

(57) ABSTRACT

A novel thermoelectric module in which the thermoelectric elements are stacked together with thermal and electrical conductors integrated in the stack to perform the dual functions of conducting both heat and electricity.

11 Claims, 9 Drawing Sheets

THERMOELECTRIC MODULE

CROSS-REFERENCE TO RELATED APPLICATIONS

The present application claims the benefit of provisional patent application Ser. No. 60/874,788, filed Dec. 14, 2006, which is incorporated herein by reference.

TECHNICAL FIELD

The present invention relates to thermoelectric (TE) technology used for the production of electricity as well as for heating or cooling. Specifically, it relates to a geometrical structure of a TE module and a method of producing such structure.

BACKGROUND OF THE INVENTION

TE technology is based on the concept that a temperature differential may be converted into electricity and vice versa. Namely, the Seebeck effect is the conversion of a temperature differential directly into electricity, and the Peltier effect is the production of a temperature differential from a difference in electric potential.

TE modules hold great promise for widespread use due to their solid state structure, silent operation, high reliability and long service life. TE modules used for power generation can produce electricity from virtually any source of heat, which could enable many energy conversion processes to increase efficiency, reduce pollutant emissions and lower costs. TE modules used for heating or cooling can achieve very sensitive temperature control, and TE modules used for cooling do not require volatile working fluids.

The conventional bulk die design for TE modules in the prior art is shown in FIGS. 1 and 2. FIG. 1 shows the exterior of such a TE module 10. FIG. 2 shows interior of TE module 10, including the thermoelectric elements 20, the electrical conductors 22 affixed on the ends of the thermoelectric elements 20, and the electrically insulating substrates 24. This design suffers:
1. Need for additional heat transfer equipment when gas or liquid mediums are used as the heat source and or heat sink. This need also results in large thermal contact resistances across mating surfaces between heat exchanger and TE module (10-15° C. loss on each side is typical). Further, this need also creates an excessive thermal path length, adds considerable mass to the overall system, and is difficult to integrate with existing heat exchange processes,
2. Long electric current path and resulting high Ohmic loss
3. Difficult and expensive component manufacture and module assembly,
4. Limited module size due to excessive thermal stress, and
5. Limitations on soldered designs to temperatures below 225° C.

Improvements in TE material production methods resulted in the conventional thin film design, as shown in FIG. 3. This TE module 30 comprises thin film thermoelectric elements 32, electrical conductors 34 on the tops and bottoms of the thermoelectric elements 32, and electrically insulating substrates 36. This design can make use of new thermoelectric material and has a much shorter electric current path than the conventional bulk die design, resulting in a reduction in Ohmic loss. However, the thinner thermoelectric elements result in increased difficulty in maintaining a sufficient temperature gradient across the thermoelectric elements. In addition, the conventional thin film design also suffers from the other disadvantages listed for the conventional bulk die design.

As a result, another thin film design has been developed, as shown in FIG. 4. This TE module 40 comprises thin film thermoelectric elements 42, electrical conductors 44 affixed to the ends of the thermoelectric elements 42, and electrically insulating substrates 46. This design has the advantages of the conventional thin film design and can withstand large temperature gradients without generating excessive thermal stress. It also has simple component manufacture and assembly. However, it still suffers from the need for additional heat transfer equipment to transfer effectively heat to and or from gas or liquid mediums via convection. It also uses thermoelectric material inefficiently and has significant limitations on stack length.

SUMMARY

The present invention comprises a novel TE module geometry and a method of producing such geometry. In this TE module geometry, the thermoelectric elements are stacked together and thermal and electrical conductors are interleaved between the thermoelectric elements to perform the dual functions of conducting both heat and electricity.

BRIEF DESCRIPTION OF THE DRAWINGS

These and other features and advantages of the present invention will be better understood by reading the following detailed description, taken together with the drawings wherein a preferred embodiment is shown as follows.

DETAILED DESCRIPTION OF THE PREFERRED EMBODIMENTS

Figure 1:
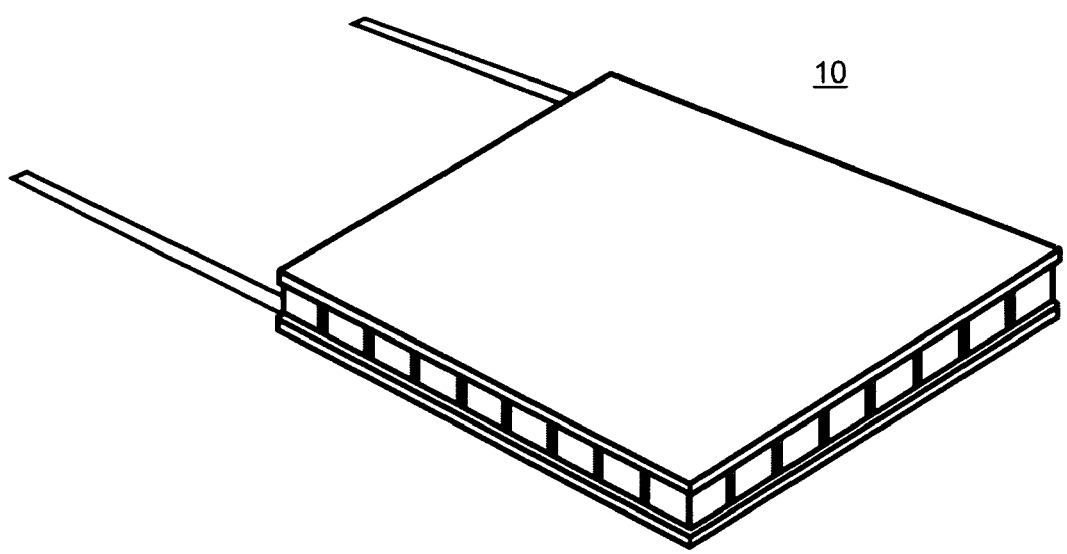
FIG. 1 shows the exterior of a bulk design TE module of the prior art.
Figure 2:
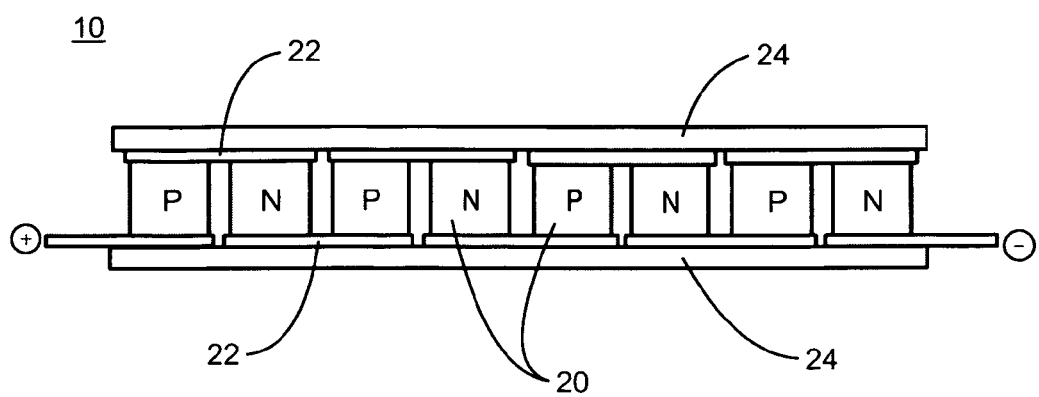
FIG. 2 shows a schematic diagram of the interior of a bulk design TE module of the prior art.
Figure 3:
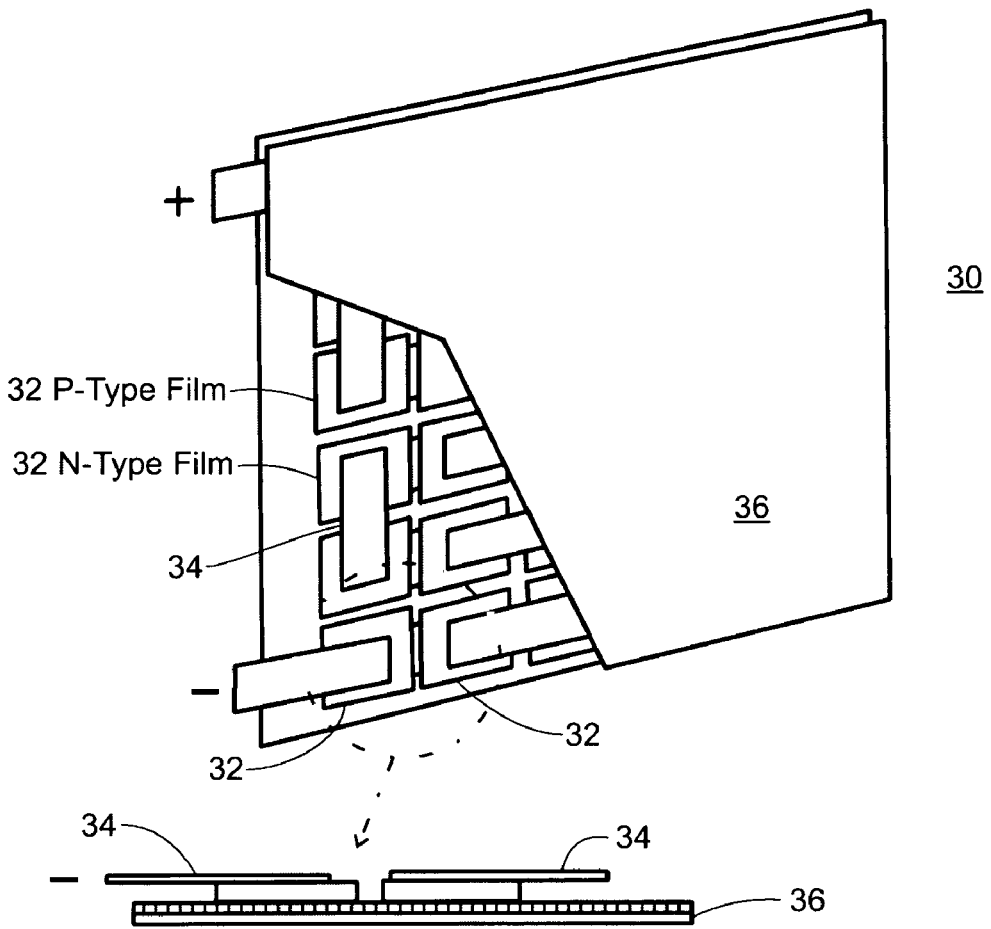
FIG. 3 shows a schematic diagram of a first thin film TE module of the prior art.
Figure 4:
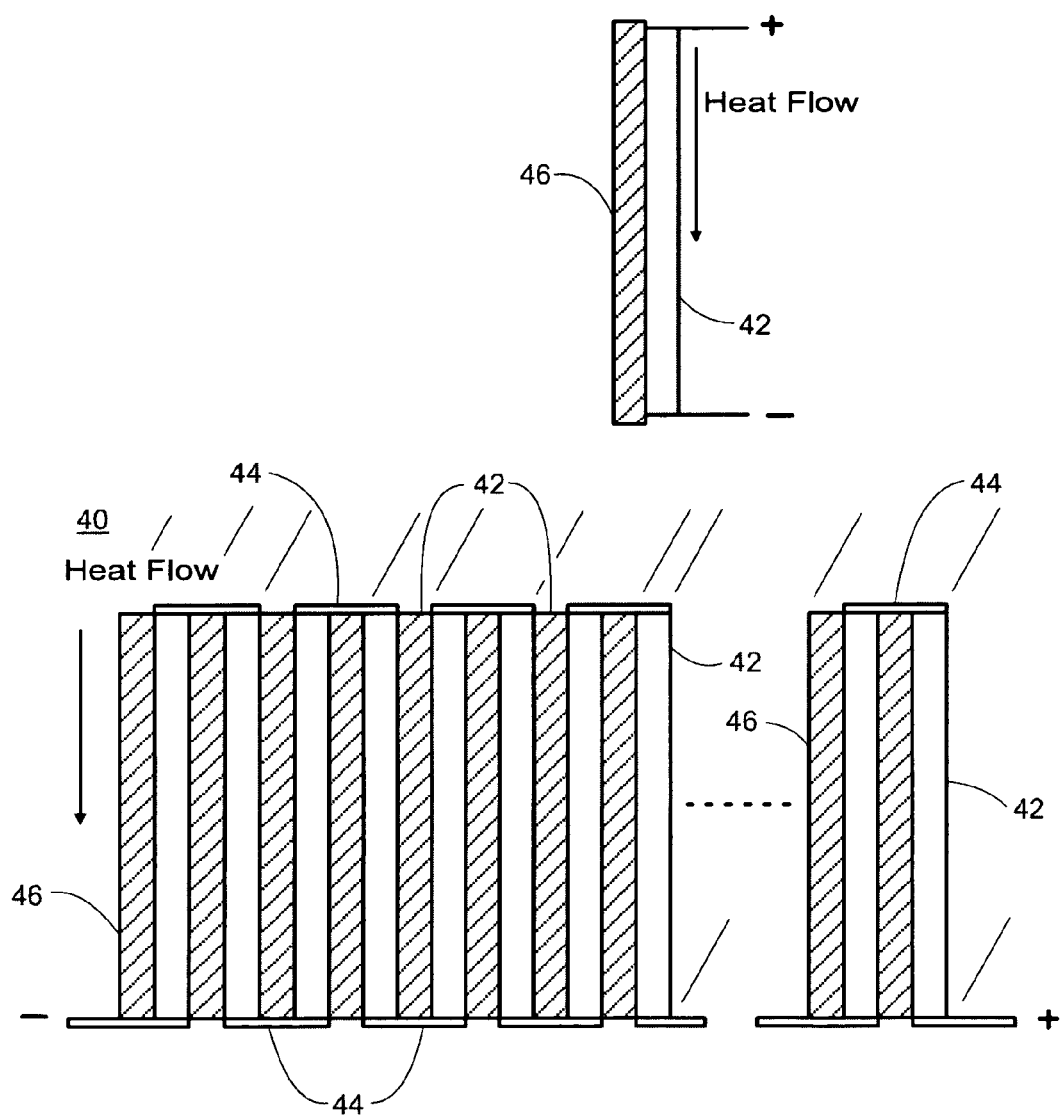
FIG. 4 shows a schematic diagram of a second thin film TE module of the prior art.
Figure 5:
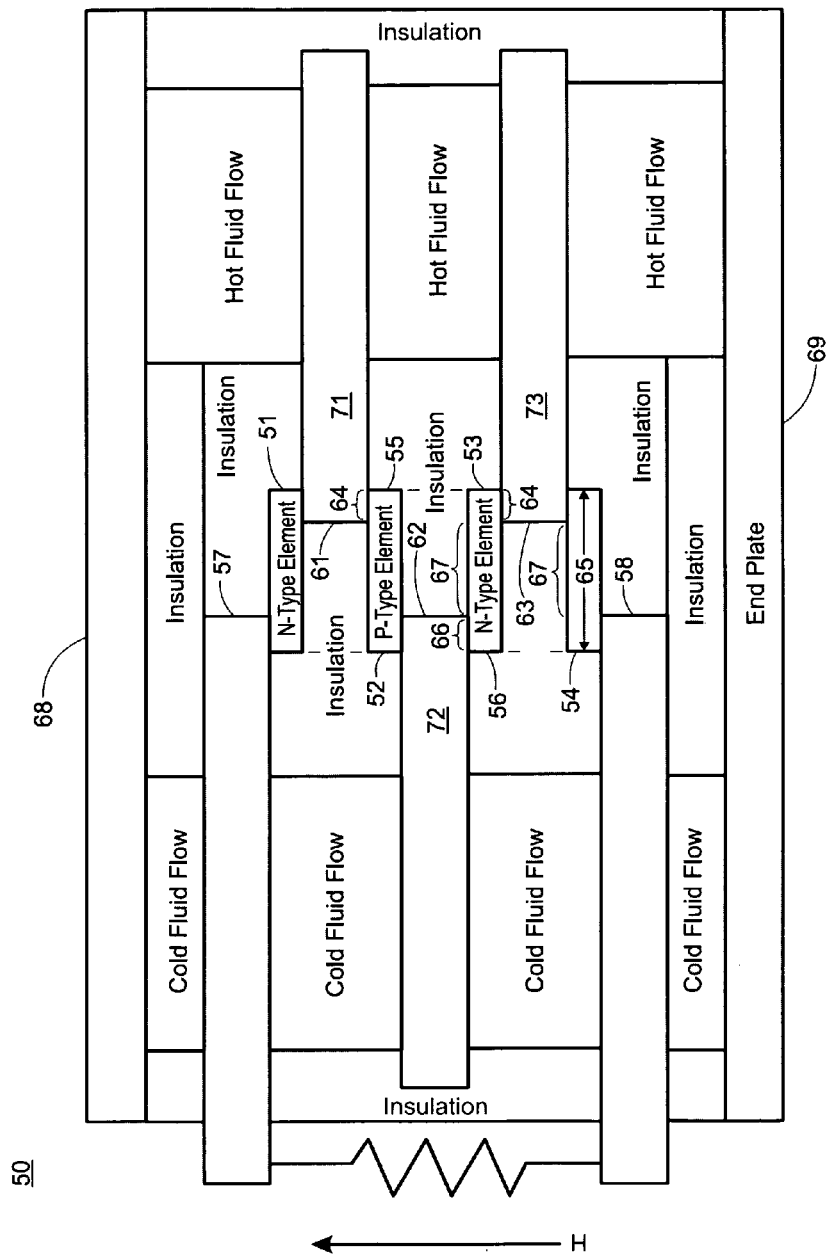
FIG. 5 shows a schematic diagram of a preferred embodiment of the TE module of the present invention.

The present invention comprises a novel TE module geometry, a preferred embodiment of which is as shown in FIG. 5. It should be noted that this drawing is not of precise geometric scale nor does it contain a realistic number of thermoelectric elements for an actual TE module. In this TE module structure, thin thermoelectric element strips are stacked together, with thermal and electrical conductors integrated within the stack. Namely, thermal and electrical conductors are interleaved in the spaces between the thermoelectric elements to perform the dual function of conducting heat and electricity. In the prior art, shown in FIGS. 1-4, electrical conductors were affixed only to the ends of the thermoelectric elements and did not perform any role in thermal transfer. In addition, the thermal and electrical conductors of the present invention can be extended outside of the stack to perform the function of accepting or rejecting heat to or from a gas or liquid medium via convection.

In the preferred embodiment shown in FIG. 5, a TE module 50 has a first thermoelectric element 51, a second thermoelectric element 52, a third thermoelectric element 53 and a fourth thermoelectric element 54 arranged in a stack. The stack has a first side 55 and a second side 56 opposite the first side 55. A top electric lead 57 is attached to the top of the first thermoelectric element 51 and a bottom element 58 is attached to the bottom of the fourth thermoelectric element 54. A top end plate 68 is placed on top of the top electric lead 57 and a bottom end plate 69 is placed on the bottom of the bottom electric lead 58.

There are first 61, second 62 and third 63 thermal and electric conductors. The first 61 and the third 63 thermal and electrical conductors are interleaved between the first thermoelectric element 51 and the second thermoelectric element 52 and between the third 53 and fourth 54 thermoelectric elements, respectively. The first thermal and electrical conductor 61 and the third thermal and electrical conductor 63 extend a first specified distance 64 into the stack from the first side 55, which distance 64 is less than the distance 65 from the first side 55 of the stack to the second side 56 of the stack. The second thermal and electrical conductor 62 is interleaved between the second thermoelectric element 52 and the third thermoelectric element 53. The second thermal and electrical conductor 62 extends a second specified distance 66 into the stack from the second side 56, which distance 66 is less than the distance 65 from the second side 56 of the stack to the first side 55 of the stack.

The distances 67 represented by the difference between (i) the sum of the first specified distance 64 and the second specified distance 66 and (ii) the distance 65 is the distance at which the temperature differential spans the thermoelectric elements 51, 52, 53, 54.

The integrated thermal and electrical conductors 61, 62, 63 afford the stack structural integrity as well as the ability to adjust the length 67 at which the temperature differential spans across the thermoelectric elements 51, 52, 53, 54. This unique combination of structural, thermal and electrical properties permits the deployment of the optimal temperature differential per unit length of thermoelectric material for a given heat source and sink. Because the length 67 at which the temperature differential spans across the thermoelectric elements 51, 52, 53, 54 can be adjusted, the optimal electrical path length and therefore optimal Ohmic loss can be achieved with this design. Also because of this unique arrangement of thermal and electrical conductors and insulation, the amount of thermoelectric material used within the stack can be minimized and therefore the performance and cost of the TE module can be maximized.

In the embodiment shown in FIG. 5, extensions 71, 72, 73 of the integrated thermal and electrical conductors 61, 62, 63 are extended out of the stack to perform the function of heat transfer fins. They would be subject to electrical charge. However, there are a number of means for producing electrical insulation of extensions 71, 72, 73 of the thermal and electrical conductors extending out of the stack. For example, a bimetallic fin, an insulative coating or a similar method known to those skilled in the art may be used to negate the potential for electrical short between the extensions of the conductors. FIG. 5 also illustrates an embodiment of the present invention where an insulating shroud affords mechanical structure for the electrically charged fins, as well as ducting for the hot and cold gases that flow through the conductor arrays.

If the TE module is to collect and reject heat from gas and or liquid mediums, then extensions of the thermal and electrical conductors would preferably be operated in counter-flow fashion, where the hot fluid would flow into the plane of FIG. 5 and the cold fluid would flow out of the plane of FIG. 5. In other embodiments, the TE module of the present invention may also be used in parallel flow configurations. The thermal and electrical conductors 61, 62, 63 do not have to extend outside of the stack and may be truncated to provide a flat surface for exchanging heat via conduction or radiation. If they are not truncated, they need not be straight, as the extensions 71, 72, 73 could be formed into high performance wavy or interrupted heat transfer surfaces using conventional plate-stamping techniques.

Copper and aluminum alloys with high thermal and electrical conductivity are a desirable thermal and electrical conductor material for low to mid temperature operation, and 400 series stainless steels or Inconel materials may be used for higher temperature operation.

Another desirable property of the geometry of the present embodiment is the relatively insignificant thermal stresses that are exhibited during operation as a result of the non-monolithic structure of the stack. To ensure sound thermal and electrical continuity, the stack can be compressed between the top end plate 68 and the bottom end plate 69 using mechanical forces applied by compression means such as screw, spring, compressed gas or other conventional compression techniques known to those skilled in the art. Sheet structures comprised on ceramic materials are desirable insulators for the present invention used in the power generation mode given their amenability to high temperature operation, low thermal conductivity, low electrical conductivity, low thermal expansion, exceptional creep resistance and low cost. Further, ceramic insulation can exhibit a high level of compliance and therefore permit the conductor materials to undergo large changes in size due to thermal expansion. The permitting of large amounts of thermal expansion enables the use of high temperature as well as very high temperature differentials relative to prior art TE technology. For similar reasons, plastics such as polyimide are a desirable insulation material for the present invention used in the cooling mode, namely due to their low thermal conductivity, low electrical conductivity, very low elastic modulus and low cost. It should be noted that there are numerous insulation materials that could be used to fabricate an embodiment of the present invention, for both power generation and heat pumping modes. Another desirable property of the TE module of the present invention is its simplicity and therefore low cost of manufacture. It is also well suited to modularity.

Figure 6:
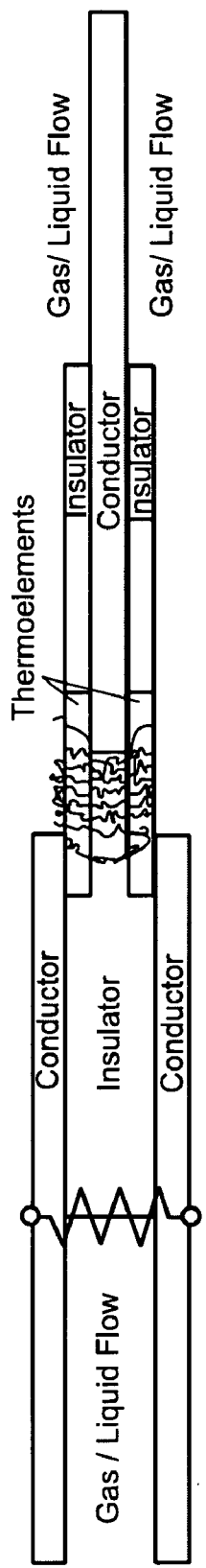
FIG. 6 shows the predicted temperature differentials of the present invention's power generation performance characteristics.
Figure 7:
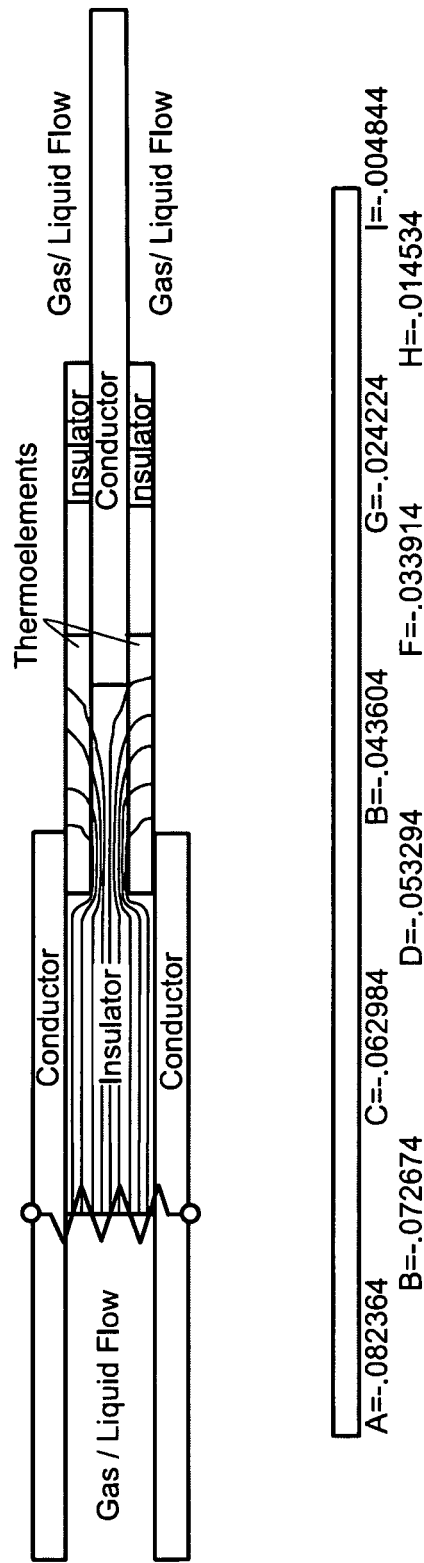
FIG. 7 shows the predicted voltage increases of the present invention's power generation performance characteristics.

The preferred embodiment of the TE module of the present invention, as shown in FIG. 5, was numerically simulated to predict its power generation performance characteristics, as illustrated with sample results shown in FIGS. 6-7. It can be seen in FIG. 6 that the vast majority of the temperature differential is reduced to the confines of the gap made by the integrated thermal and electrical conductors. As mentioned previously, this is a key feature of the present invention as it enables optimization of the electrical current path length without sacrificing other performance altering criteria. It can also be seen in FIG. 7 that a clear, step by step series of voltage increments are produced by the TE module of the present invention. It should be noted that material property data for conventional bismuth telluride-based thermoelectric elements were used to calculate the results shown in FIGS. 6-7.

The following data set contains results from various trail runs with the previously described mathematical model.

Boundary Conditions
Hot side temperature=400° C.
Cold side temperature=150° C.
Temperature differential=250° C.
Matched load=0.091Ω for two couples in series
Results (Data Presented for Two Couples in Series)
Open circuit voltage at operating temperature=0.200 (VDC)
Current under matched load=1.102 (Amp)
Voltage under matched load=0.100 (VDC)
Power under matched load=0.111 (W)

Figure 8:
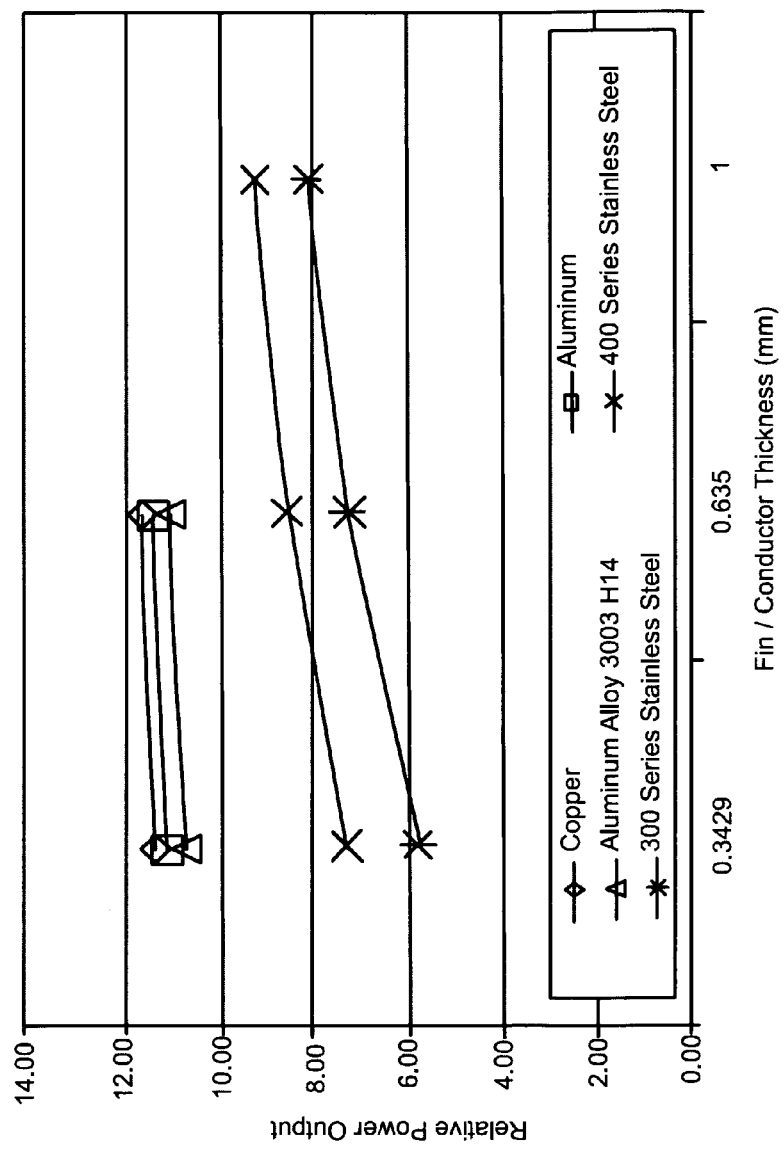
FIG. 8 shows the predicted results of changing the thermal and electrical conductor thickness and material type.

The results of numerical modeling trade studies on the effect of changing the conductor thickness and material type are shown in FIG. 8. It can be seen that copper, with its superior combination of low electrical resistivity and high thermal conductivity yields the highest power output relative to aluminum, Al alloy 3003 H14, as well as the 300 and 400 series stainless steels. However, the high temperature oxidation resistance of copper is poor, such that aluminum is a more attractive material for low to mid temperature operation, and due to the oxidation resistance and high electrical and thermal conductivity, the 400 series stainless steel is a more attractive material for mid to high temperature operation. It should also be noted that the overall performance of a particular conductor material is strongly dependent upon its thermal conductivity and weakly dependent upon its electrical resistivity.

Figure 9:
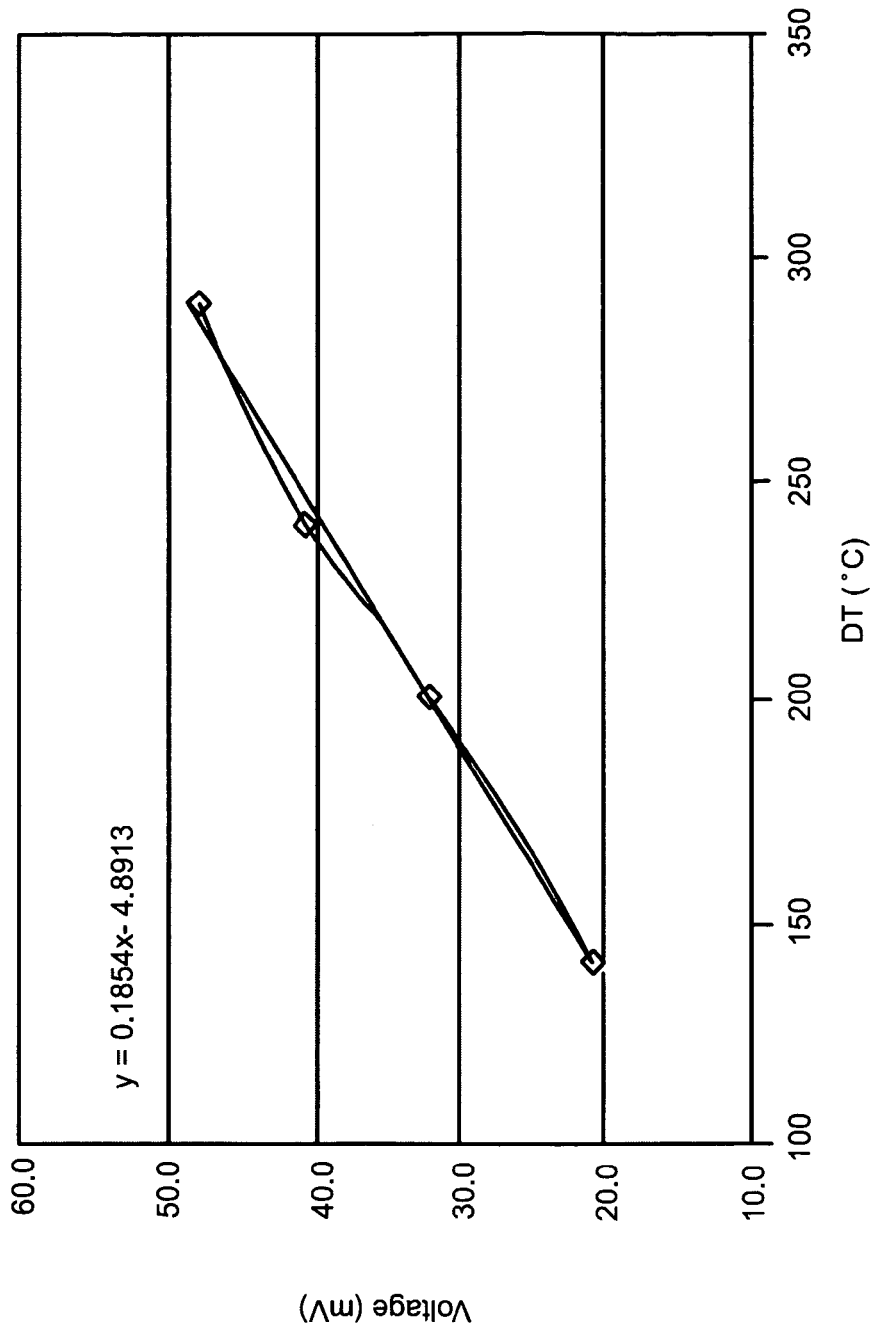
FIG. 9 shows the plot of open circuit voltage versus temperature difference from a test of the present invention in power generation mode.

A preferred embodiment of the TE module of the present invention was fabricated with copper conductors and tested in the power generation mode. The open circuit voltage measured from this three cell stack, as shown in FIG. 9, was plotted against the difference in fluid outlet temperatures that were simultaneously measured. The open circuit voltage was directly proportional to the temperature difference, as is expected. It is also noted that the module performed successfully when subjected to a fluid temperature differential of 300° C., a temperature differential in which most TE technology fails due to limitations of thermal stress and or solder melt temperature. It is further noted that the hot gas temperature was limited to 380° C. because of the heat source, and was in no way limited by the TE module of the present invention.

It is noted that virtually any type of thermoelectric material may be used within the TE module of the present invention for optimal heating, cooling or power generation performance. It should also be reiterated that this concept is highly amenable to power generation, namely in a power plant or industrial process where it could significantly enhance existing heat exchange processes. Namely, intercooling, recuperation or even condenser processes may be enhanced with the present invention, resulting in increased efficiency, reduced pollutant emission, reduced cooling system size and water use (if applicable). For electricity generation in transport vehicles it could enable the long sought "more electric" vehicle concepts, in addition to increasing efficiency and reducing pollutant emission. For remote or distributed power applications it could be used to produce electricity from the combustion effluent of fossil fuels or from heat provided by an advanced solar energy collection system. Conversely, the geometrical structure of the present invention could also be used for providing silent, reliable, long lasting and precise temperature control for a wide array of stationary and mobile heat pumping applications.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention.

What is claimed is:

1. A thermoelectric module comprising:
   a first thermoelectric element, a second thermoelectric element, and a third thermoelectric element arranged in a stack with a first side and a second side opposite the first side, wherein each element extends from the first side to the second side;
   a first thermal and electrical conductor interleaved between the first thermoelectric element and the second thermoelectric element so that it extends a first specified distance into the stack from the first side, which specified distance is less than the distance from the first side to the second side; and
   a second thermal and electrical conductor interleaved between the second thermoelectric element and the third thermoelectric element so that it extends a second specified distance into the stack from the second side, which second specified distance is less than the distance from the second side to the first side, wherein the thermal and electrical conductors space the thermoelectric elements from other thermoelectric elements in the stack, wherein an extension of a thermal and electrical conductor extends outwardly from the stack, the extension forming a heat transfer fin configured to extend into a fluid medium.

2. The thermoelectric module of claim 1 wherein a means for producing electrical insulation electrically insulates the extension of a thermal and electrical conductor, which extends outwardly from the stack, preventing electrical interaction with the fluid medium.

3. The thermoelectric module of claim 1 further comprising a top end plate above the first thermoelectric element, a bottom end plate below the third thermoelectric element, and a means for compressing the stack of thermoelectric elements and interleaved thermal and electrical conductors between the end plates.

4. A method of producing a thermoelectric module comprising:
   arranging a first thermoelectric element, a second thermoelectric element, and a third thermoelectric element in a stack with a first side and a second side opposite the first side, wherein each element extends from the first side to the second side;
   interleaving a first thermal and electrical conductor between the first thermoelectric element and the second thermoelectric element so that it extends a first specified distance into the stack from the first side, which first specified distance is less than the distance from the first side to the second side, the first thermal and electrical conductor conducting heat and electricity between the first thermoelectric element and the second thermoelectric element, and spaces the first thermoelectric element from the second thermoelectric element; and
   interleaving a second thermal and electrical conductor between the second thermoelectric element and the third thermoelectric element so that it extends a second specified distance into the stack from the second side, which second specified distance is less than the distance from the second side to the first side, the second thermal and electrical conductor conducting heat and electricity between the second thermoelectric element and the third thermoelectric element, and spaces the second thermoelectric element from the third thermoelectric element; and extending an extension of the first thermal and electrical conductor and of the second thermal and electrical conductor outwardly from the stack, the extensions forming a heat transfer fin configured to extend into a fluid medium.

5. The method of claim 4 further comprising electrically insulating the extension of the thermal and electrical conductor, which extends outwardly from the stack, preventing electrical interaction with the fluid medium.

6. The method of claim 4 further comprising compressing the stack between a top end plate above the first thermoelectric element and a bottom end plate below the third thermoelectric element.

7. A thermoelectric module comprising:
a first thermoelectric element, a second thermoelectric element, and a third thermoelectric element arranged in a stack;
a top end plate above the first thermoelectric element, a bottom end plate below the third thermoelectric element;
the stack having a first side and a second side generally perpendicular to the top end plate and the bottom end plate, each of the thermoelectric elements extends from the first side to the second side;
a first thermal and electrical conductor interleaved between and spacing the first thermoelectric element and the second thermoelectric element, the first thermal and electrical conductor conducting heat and electricity between the first thermoelectric element and the second thermoelectric element, the first thermal and electrical conductor extends a first specified distance into the stack from the first side, which specified distance is less than the distance from the first side to the second side, the first thermal and electrical conductor having an extension that extends outwardly from the stack forming a heat transfer fin configured to extend into a fluid medium; and
a second thermal and electrical conductor interleaved between and spacing the second thermoelectric element and the third thermoelectric element, the second thermal and electrical conductor conducting heat and electricity between the second thermoelectric element and the third thermoelectric element, the second thermal and electrical conductor extends a second specified distance into the stack from the second side, which second specified distance is less than the distance from the second side to the first side, the second thermal and electrical conductor having an extension that extends outwardly from the stack forming a heat transfer fin configured to extend into a fluid medium.

8. The thermoelectric module of claim 7 wherein a means for producing electrical insulation electrically insulates the extension of a thermal and electrical conductor, which extends outwardly from the stack, preventing electrical interaction with the fluid medium.

9. A thermoelectric module comprising:
at least four thermoelectric elements arranged in a stack including a first thermoelectric element and a last thermoelectric element;
a top end plate above the first thermoelectric element, a bottom end plate below the last thermoelectric element;
the stack having a first side and a second side generally perpendicular to the top end plate and the bottom end plate, each of the thermoelectric elements extends from the first side to the second side; and
a plurality of thermal and electrical conductors,
at least three of the plurality of thermal and electrical conductors each interleaved between and spacing adjacent thermoelectric elements,
one of the plurality of thermal and electrical conductors interleaved between and spacing the top end plate and the first thermoelectric element,
another one of the plurality of the thermal and electrical conductors interleaved between and spacing the bottom end plate and the last thermoelectric element,
a set of alternating thermal and electrical conductors of the plurality of thermal and electrical conductors interleaved between the thermoelectric elements extending a first specified distance into the stack from the first side, which specified distance is less than the distance from the first side to the second side, the set of alternating thermal and electrical conductors have an extension that extends outwardly from the stack, and
a second set of alternating thermal and electrical conductors of the plurality of thermal and electrical conductors interleaved between the thermoelectric elements extending a second specified distance into the stack from the second side, which specified distance is less than the distance from the second side to the first side wherein thermal and electrical conductors conduct heat and electricity between adjacent thermoelectric elements; and
the extensions of the alternating thermal and electrical conductors each forming a heat transfer fin configured to extend into a fluid medium for heat transfer.

10. A thermoelectric module of claim 9 wherein a means for producing electrical insulation electrically insulates the extension of a thermal and electrical conductor, which extends outwardly from the stack, preventing electrical interaction with the fluid medium.

11. A thermoelectric module of claim 10 further comprising an insulating shroud extending between the two end plates and enclosing the thermoelectric elements.

* * * * *